(12) United States Patent
Mieno et al.

(10) Patent No.: US 8,409,883 B2
(45) Date of Patent: *Apr. 2, 2013

(54) METHOD FOR FABRICATING A PHASE CHANGE MEMORY

(75) Inventors: Fumitake Mieno, Shanghai (CN); Youfeng He, Shanghai (CN)

(73) Assignee: Semiconductor Manufacturing International Corp., Shanghai (CN)

( * ) Notice: Subject to any disclaimer, the term of this patent is extended or adjusted under 35 U.S.C. 154(b) by 70 days.

This patent is subject to a terminal disclaimer.

(21) Appl. No.: 13/157,076

(22) Filed: Jun. 9, 2011

(65) Prior Publication Data

US 2012/0161097 A1 Jun. 28, 2012

(30) Foreign Application Priority Data

Dec. 27, 2010 (CN) .......................... 2010 1 0608394

(51) Int. Cl.
*H01L 21/00* (2006.01)

(52) U.S. Cl. .............................................. 438/23; 257/5

(58) Field of Classification Search .................... 438/23; 257/5, E27.004, E21.645
See application file for complete search history.

(56) References Cited

U.S. PATENT DOCUMENTS

| 7,671,395 B2 | 3/2010 | Park et al. | |
| 2012/0161092 A1* | 6/2012 | Mieno et al. | 257/2 |

FOREIGN PATENT DOCUMENTS

CN 101882602 11/2010

* cited by examiner

*Primary Examiner* — Phuc Dang
(74) *Attorney, Agent, or Firm* — Anova Law Group, PLLC (57) ABSTRACT

The invention provides a phase change memory and a method for forming the phase change memory. The phase change memory includes a storage region and a peripheral circuit region. The peripheral circuit region has a peripheral substrate, peripheral shallow trench isolation (STI) units in the peripheral substrate, and MOS transistors on the peripheral substrate and between the peripheral STI units. The storage region has a storage substrate, an N-type ion buried layer on the storage substrate, vertical LEDs on the on the N-type ion buried layer, storage shallow trench isolation (STI) units between the vertical LEDs, and phase change layers on the vertical LEDs and between the storage STI units. The storage STI units have thickness equal to thickness of the vertical LEDs. Each vertical LED comprises an N-type conductive region on the N-type ion buried layer, and a P-type conductive region on the N-type conductive region. The P-type conductive region contains SiGe. The peripheral STI units have thickness equal to thickness of the storage STI units. A top of P-type conductive region is flush with a top of the peripheral substrate. The P-type conductive region containing SiGe reduces drain current through the vertical LED and raises current efficiency of the vertical LED. The peripheral circuit region can work normally without adverse influence on performance of the phase change memory.

15 Claims, 6 Drawing Sheets

METHOD FOR FABRICATING A PHASE CHANGE MEMORY

CROSS REFERENCE TO RELATED APPLICATIONS

The present application claims the priority of Chinese Patent Application No. 201010608394.0, entitled "PHASE CHANGE MEMORY AND METHOD FOR FABRICATING THE SAME", and filed Dec. 27, 2010, the entire disclosure of which is incorporated herein by reference.

BACKGROUND OF THE INVENTION

1. Field of the Invention

The present invention relates to the field of semiconductor manufacture, and particularly to a phase change memory and a method for fabricating the same.

2. Background of the Invention

Nowadays, a phase change RAM is put forward as a new nonvolatile memory for new type memory application. As for the phase change memory, a storage unit is formed with phase change material for serving as data storage medium. Heat is supplied for phase change of phase change material. According to the supplied heat, the phase change material has two stable phases, for example non-crystal phase and crystal phase. Typical phase change material comprises Ge—Sb—Te (GST), a composition of Ge, Sb and Te, and the like.

When the phase change material is heated at the proximity of melted temperature for a short time and then is cooled rapidly, it may phase change from crystal phase to non-crystal phase. Reversely, when the phase change material is heated below the melted temperature for a long time and then is cooled slowly, it may phase change from non-crystal phase to crystal phase. The phase change material under the non-crystal phase has higher resistance ratio than under the crystal phase. Thus, it can be determined by current through phase change material, that the data stored in the storage unit of the phase change memory is logic "1" (non-crystal phase and high resistance ratio) or logic "0" (crystal phase and low resistance ratio).

In prior art, the phase change memory is LED driven, in which LED and phase change material are both deposited in a vertical insulated material hole. By the virtue of the robust drive ability of the LED, size of the devices and cross-talk between devices is minimized at most, and stability of the phase change is enhanced.

Figure 1:
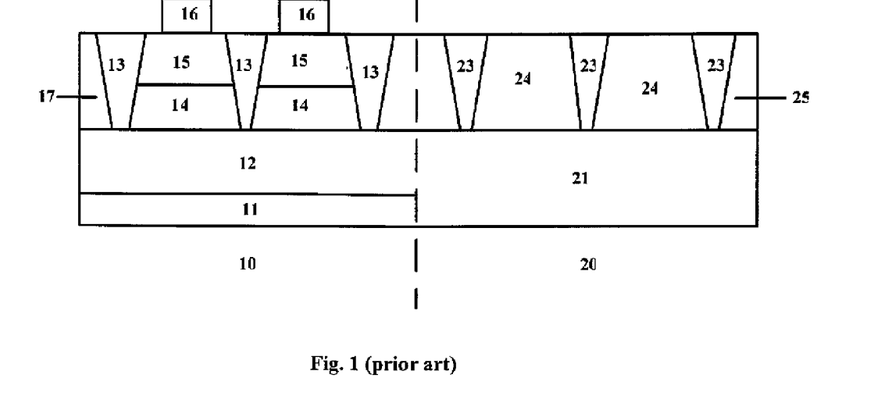
FIG. 1 schematically shows a vertical LED driven phase change memory in prior art.

As shown in FIG. 1, a vertical LED driven phase change memory comprises a storage region 10 and a peripheral circuit region 20.

The storage region 10 comprises a storage substrate 11, an N-type ion buried layer 12 on the storage substrate 11, a storage monocrystalline layer 17 on the N-type ion buried layer 12, storage shallow trench isolation (STI) units 13 in the storage monocrystalline layer 17, vertical LEDs and phase change layers 16 on the vertical LEDs. Each storage shallow trench isolation (STI) unit 13 has thickness identical to that of the storage monocrystalline layer 17. The vertical LED comprises an N-type conductive region 14 in the storage monocrystalline layer 17 and between the storage shallow trench isolation (STI) units 13, and a P-type conductive region 15 on the N-type conductive region 14. The vertical LED has thickness identical to that of the storage monocrystalline layer 17.

The peripheral circuit region 20 comprises a peripheral substrate 21, a peripheral monocrystalline layer 25 on the peripheral substrate 21, peripheral shallow trench isolation (STI) units 23 in the monocrystalline layer 25, MOS transistors 24 in the peripheral monocrystalline layer 25 and between the peripheral shallow trench isolation (STI) units 23. Thickness of the peripheral substrate 21 is equal to a sum of that of the N-type ion buried layer 12 and that of the storage substrate 11. The peripheral shallow trench isolation (STI) units 23 have thickness identical to that of the peripheral monocrystalline layer 25.

FIGS. 2-7 are cross-sectional views of intermediate structures of a vertical LED driven phase change memory, illustrating a conventional method for forming the vertical LED driven phase change memory.

Figure 2:
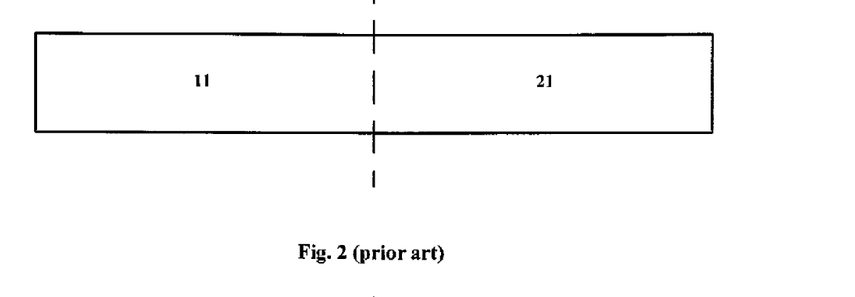
FIGS. 2-7 are cross-sectional views of intermediate structures of a prior art phase change memory, illustrating a conventional method for forming the phase change memory.

Referring to FIG. 2, a substrate is provided, which comprises at least a storage substrate 11 and a peripheral substrate 21.

Figure 3:
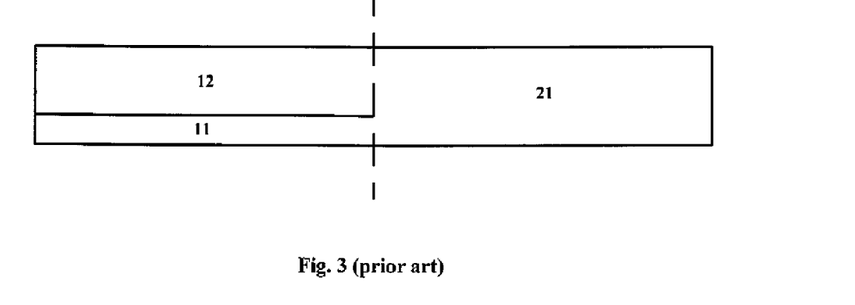

Referring to FIG. 3, ions (for example arsenic ions) are implanted into the storage substrate 11 to form an N-type ion buried layer 12.

Figure 4:
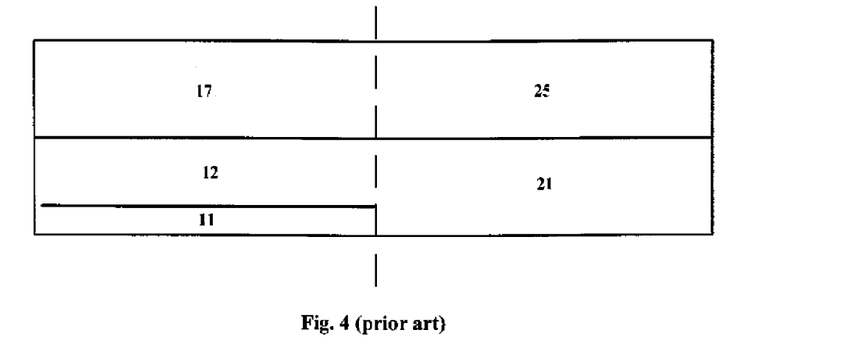

Referring to FIG. 4, the storage monocrystalline layer 17 grows on the N-type ion buried layer 12 by non-selective extensive process. The peripheral monocrystalline layer 25 grows on the peripheral substrate 21 by non-selective extensive process.

Figure 5:
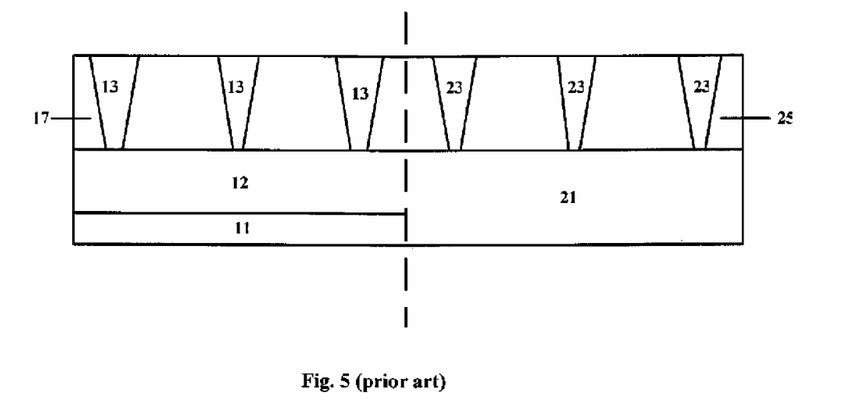

Referring to FIG. 5, the storage STI units 13 are formed in the storage monocrystalline layer 17 in such as way that each storage shallow trench isolation (STI) unit 13 has thickness identical to that of the storage monocrystalline layer 17. The peripheral STI units 23 are formed in the peripheral monocrystalline layer 25 in such a way that the peripheral shallow trench isolation (STI) units 23 have thickness identical to that of the peripheral monocrystalline layer 25.

Figure 6:
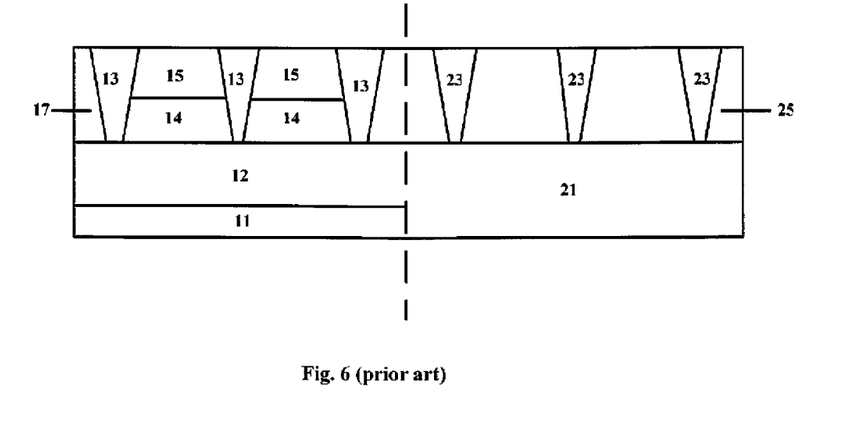

Referring to FIG. 6, the vertical LEDs are formed in the storage monocrystalline layer 17 and between the storage shallow trench isolation (STI) units 13. Each vertical LED comprises an N-type conductive region 14 and a P-type conductive region 15. During the process of formation, N-type ions are implanted into a lower part of the storage monocrystalline layer 17 to form the N-type conductive region 14, and P-type ions are implanted into an upper part of the storage monocrystalline layer 17 to form the P-type conductive region 15 on the N-type conductive region 14. Each vertical LED has an N-type conductive region 14 and a P-type conductive region 15. Thickness of the vertical LED is identical to that of the storage monocrystalline layer 17.

Figure 7:
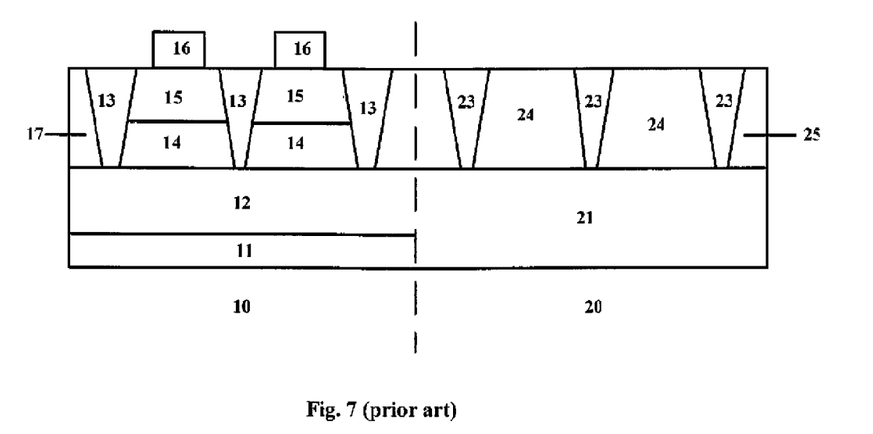

Referring to FIG. 7, phase change layers 16 are formed on the P-type conductive region 15. The MOS transistors 24 are formed in the peripheral monocrystalline layer 25. Finally, a storage region 10 and a peripheral circuit region 20 are completed.

In practical application, the peripheral circuit region 20 may not work. Furthermore, a phase change memory requires high density and low energy consumption. It is desired to reduce drain current of the vertical LEDs and raise the current efficiency of the vertical LEDs. However, in prior art, the vertical LEDs have silicon-based PN junction, carrier drain current formed by electrical field may occur at the PN junction.

SUMMARY OF THE INVENTION

A technical problem solved by the invention is to provide a phase change memory which has vertical LEDs with low drain current and high current efficiency, and which has a peripheral circuit region working normally without adverse influence on performance of the phase change memory.

Another technical problem solved by the invention is to provide a method for fabricating the phase change memory.

According to one aspect of the invention, a phase change memory comprises a storage region and a peripheral circuit region. The peripheral circuit region comprises a peripheral substrate, peripheral shallow trench isolation (STI) units in the peripheral substrate, and MOS transistors on the peripheral substrate and between the peripheral STI units. The storage region comprises a storage substrate, an N-type ion buried layer on the storage substrate, vertical LEDs on the N-type ion buried layer, storage shallow trench isolation (STI) units between the vertical LEDs, and phase change layers on the vertical LEDs and between the storage STI units. The storage STI units have thickness equal to thickness of the vertical LEDs. The peripheral STI units have thickness equal to thickness of the storage STI units. Each vertical LED comprises an N-type conductive region on the N-type ion buried layer, and a P-type conductive region on the N-type conductive region. The P-type conductive region contains SiGe. A top of P-type conductive region is flush with a top of the peripheral substrate.

According to another aspect of the invention, a method for fabricating a phase change memory comprises:

providing a substrate including a storage substrate and a peripheral substrate forming a sacrificial dielectric layer on the peripheral substrate;

etching the storage substrate and forming an N-type ion buried layer on the storage substrate;

forming vertical LEDs on the N-type ion buried layer, each vertical LED comprising an N-type conductive region on the N-type ion buried layer, and a P-type conductive region on the N-type conductive region, the P-type conductive region containing SiGe, a top of P-type conductive region being flush with a top of the peripheral substrate;

removing the sacrificial dielectric layer on the peripheral substrate;

forming storage STI units between the vertical LEDs, and forming peripheral STI units in the peripheral substrate, the storage STI units having thickness equal to thickness of the vertical LED, and the peripheral STI units having thickness equal to thickness of the storage STI units; and forming phase change layers on the vertical LEDs and between the storage STI units, and forming MOS transistors on the peripheral substrate and between the peripheral STI units.

Optionally, the SiGe contains Ge concentration with a molar ratio ranging from 20% to 60%.

Optionally, the N-type conductive region contains SiC.

Optionally, the SiC of the N-type conductive region has C concentration with a molar ratio ranging from 1% to 3%.

Optionally, the sacrificial dielectric layer has thickness ranging from 5 nm to 50 nm.

Optionally, the N-type ion buried layer is formed by implanting N-types ions into the storage substrate before etching the storage substrate or after etching the storage substrate.

Optionally, the N-type conductive region is formed on the N-type ion buried layer by selective epitaxial growth, and reaction gases for selective epitaxial growth comprise Si atoms and N-type ions.

Optionally, the N-type conductive region is formed on the N-type ion buried layer by selective epitaxial growth, and reaction gases for selective epitaxial growth comprise SiC and N-type ions.

Optionally, the P-type conductive region is formed on the N-type conductive region by selective epitaxial growth, and reaction gases comprise SiGe and P-type ions.

Optionally, oxide or nitride is deposited on the peripheral substrate by low pressure chemical vapor deposition or plasma enhanced chemical vapor deposition for forming the sacrificial dielectric layer.

With the structure of the invention, the phase change memory has high density and low power consumption. In the phase change memory of the invention, the P-type conductive region containing SiGe reduces drain current through the vertical LEDs, thereby raising current efficiency of the vertical LEDs. Under forward bias, a barrier of a P—SiGe and N—Si hetero junction is alleviated at N—Si. Transition of electrons from the N—Si to P—SiGe is apt to occur. On the contrary, holes in the N—Si are apt to remain stored instead of transition to P—SiGe. Current is mainly produced by electrons transition from N-type conductive region to P-type conductive region. Under reverse bias, a barrier of the P—SiG and N—Si hetero junction is elevated at N—Si. Electrons in the N—Si are apt to remain stored instead of transition to P—SiGe. Electrons in the P-type conductive region and holes in the N-type conductive region are comparatively less. In this circumstance, the P—SiGe and N—Si hetero junction decreases drain current produced by carriers from the electrical field, which works similar to that of Silicon PN junction.

On the other hand, the storage substrate is etched, and height difference is apparently formed between the storage substrate and the peripheral substrate. The sacrificial dielectric layer is formed on the peripheral substrate for forming the N-type ion buried layer and the vertical LEDs on the storage substrate in sequence. A top of the vertical LEDs is flush with a top of the peripheral substrate. Then the sacrificial dielectric layer on the peripheral substrate is removed. In this way, a monocrystalinne layer on the peripheral substrate is not needed. The fabrication cost is reduced correspondingly. The peripheral circuit region can work perfectly without adverse influence on the phase change memory.

BRIEF DESCRIPTION OF THE DRAWINGS

The foregoing and other objects, features and advantages of the invention will be more apparent from the detailed description of the preferred embodiments of the invention as shown in the accompanying drawings, in which identical reference numerals denote the same component. The drawings are not to scale, but focus on the major idea of the invention.

DETAILED DESCRIPTION OF THE EMBODIMENTS

Numerous design details are described hereinafter for a better understanding of the invention. However, the invention can be implemented in other ways different from these described herein, and those skilled in the art can make modifications or alternations without departing from the scope of the invention. Therefore, the invention shall not be limited to the embodiments described below.

As mentioned above, in a conventional method for forming a phase change memory, a peripheral circuit region can not work normally, and the vertical LEDs with silicon-based PN junction may produce carrier drain current formed by electrical field at the PN junction, which can not meet requirement of high density and low power consumption of the phase change memory.

In order to overcome the deficiencies, the present invention provides a phase change memory, which comprises a storage region and a peripheral circuit region.

The peripheral circuit region comprises a peripheral substrate, peripheral shallow trench isolation (STI) units in the peripheral substrate, and MOS transistors on the peripheral substrate and between the peripheral STI units.

The storage region comprises a storage substrate, an N-type ion buried layer on the storage substrate, vertical LEDs on the on the N-type ion buried layer, storage shallow trench isolation (STI) units between the vertical LEDs, and phase change layers on the vertical LEDs and between the storage STI units. The storage STI units have thickness equal to thickness of the vertical LEDs. The peripheral STI units have thickness equal to thickness of the storage STI units.

Each vertical LED comprises an N-type conductive region on the N-type ion buried layer, and a P-type conductive region on the N-type conductive region. The P-type conductive region contains SiGe. A top of P-type conductive region is flush with a top of the peripheral substrate.

The present invention further provides a method for fabricating the phase change memory.

Figure 16:
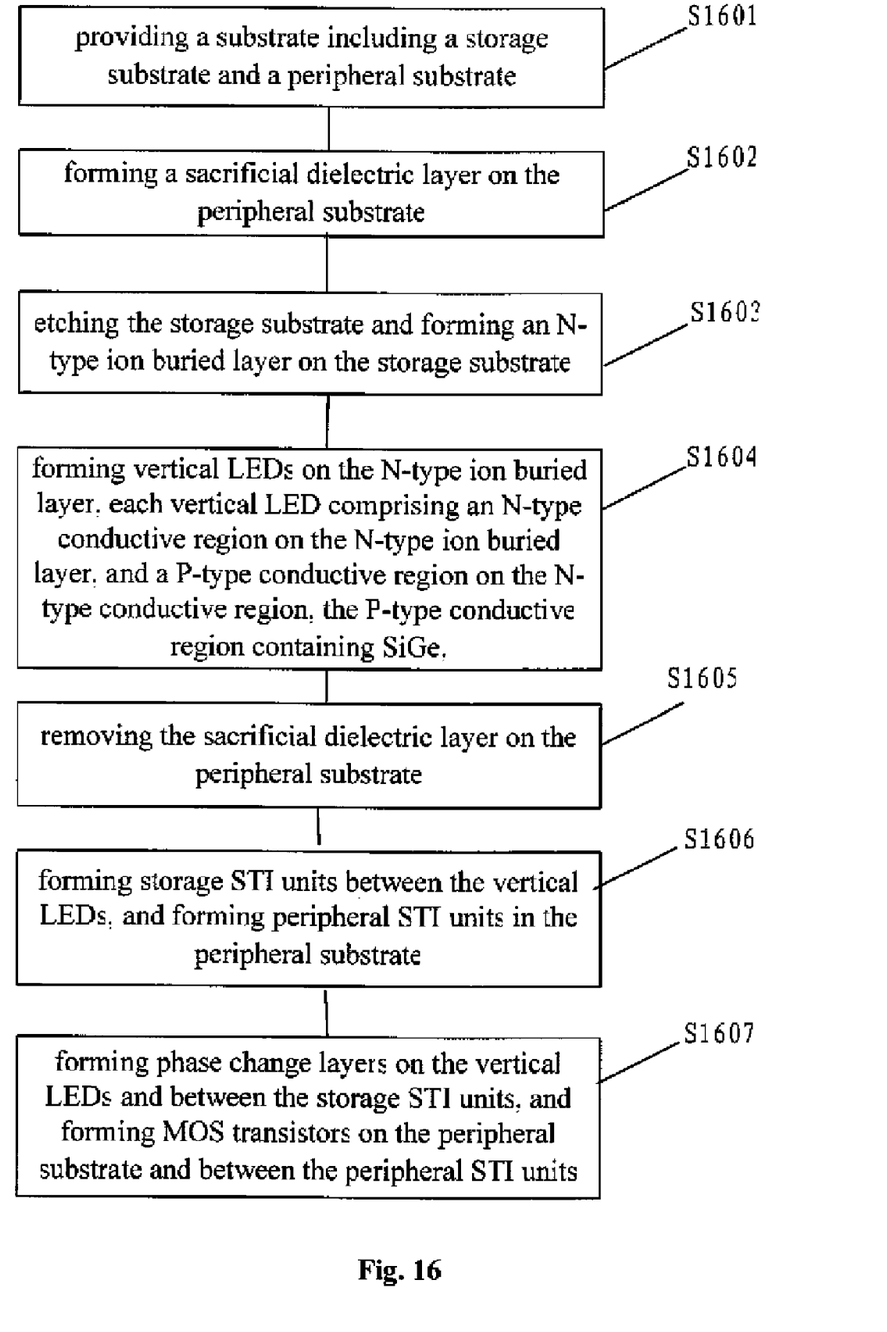
FIG. 16 is a flow chart of the method for forming the phase change memory according to an embodiment of the present invention.

The method comprises:

S1601: providing a substrate including a storage substrate and a peripheral substrate;

S1602: forming a sacrificial dielectric layer on the peripheral substrate;

S1603: etching the storage substrate and forming an N-type ion buried layer on the storage substrate;

S1604: forming vertical LEDs on the N-type ion buried layer. Each vertical LED comprises an N-type conductive region on the N-type ion buried layer, and a P-type conductive region on the N-type conductive region. The P-type conductive region contains SiGe. A top of P-type conductive region is flush with a top of the peripheral substrate.

S1605: removing the sacrificial dielectric layers on the peripheral substrate;

S1606: forming storage STI units between the vertical LEDs, and forming peripheral STI units in the peripheral substrate. The storage STI units have thickness equal to thickness of the vertical LEDs, and the peripheral STI units have thickness equal to thickness of the storage STI units.

S1607: forming phase change layers on the vertical LEDs and between the storage STI units, and forming MOS transistors on the peripheral substrate and between the peripheral STI units.

The P-type conductive region containing SiGe reduces drain current in the vertical LEDs, and raises current efficiency of the vertical LEDs. The peripheral circuit region can work normally without adverse influence on performance of the phase change memory.

Figure 8:
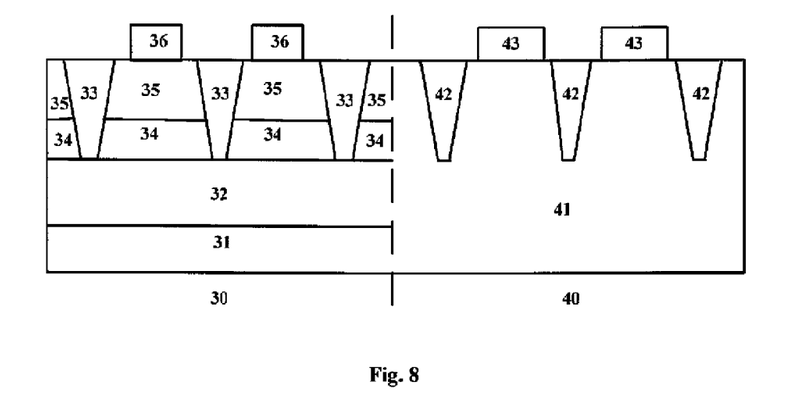
FIG. 8 schematically shows a phase change memory according to an embodiment of the present invention.

As shown in FIG. 8, according to one embodiment of the invention, the phase change memory comprises a storage region 30 and a peripheral circuit region 40.

The storage region 30 comprises a storage substrate 31, an N-type ion buried layer 32 on the storage substrate 31, vertical LEDs on the N-type ion buried layer 32, storage shallow trench isolation (STI) units 33 in the vertical LEDs, and phase change layers 36 on the vertical LEDs and between the storage STI units 33.

Each vertical LED comprises an N-type conductive region 34 on the N-type ion buried layer 32, and a P-type conductive region 35 on the N-type conductive region 34. The P-type conductive region 35 contains P-type ions and SiGe. The SiGe contains Ge concentration with a molar ratio ranging from 20% to 60%.

The storage STI units have thickness equal to thickness of the vertical LEDs. The peripheral STI units have thickness equal to thickness of the storage STI units.

The peripheral circuit region 40 comprises a peripheral substrate 41, peripheral shallow trench isolation (STI) units 42 in the peripheral substrate 41, and MOS transistors 43 on the peripheral substrate 41 and between the peripheral STI units 42. A top of the P-type conductive region 35 is flush with a top of the peripheral substrate 41. The peripheral STI units 42 have thickness equal to thickness of the storage STI units 33.

In one embodiment, the storage substrate 31 and the peripheral substrate 41 are both silicon-based. The N-type ion buried layer 32 contains arsenic ions. The N-type ions are selected from arsenic ions and phosphorus ions. The P-type ions may be boron ions. The implant energy and dopant concentration of the N-type ions and the P-type ions are well known to the skilled in the art.

The number of the MOS transistors 43 of the peripheral circuit region 40 is not limited, for example one or more, and may vary depending on requirements of functions of the peripheral circuit region 40.

In one embodiment, N-type conductive region 34 contains SiC which has C concentration with a molar ratio ranging from 1% to 3%.

In one embodiment, a heating layer (not shown) is formed between the P-type conductive region 35 and the phase change layer 36.

FIGS. 9-15 illustrate a method for fabricating the phase change memory of FIG. 8, according to an embodiment of the present invention.

Figure 9:
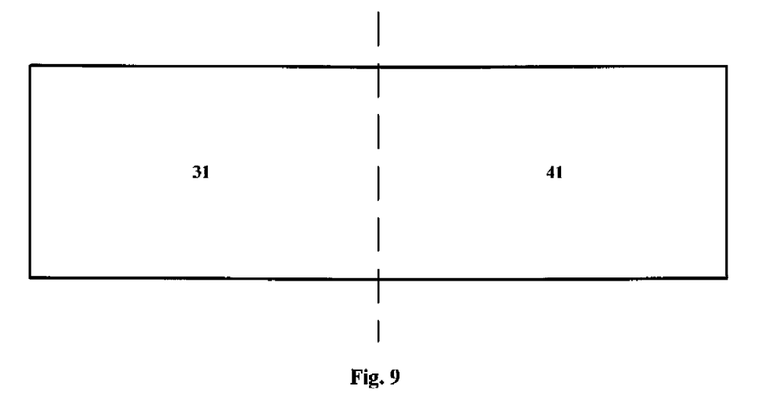
FIGS. 9-15 are cross-sectional views of intermediate structures of the phase change memory, illustrating a method for forming the phase change memory according to an embodiment of the present invention.
Figure 10:
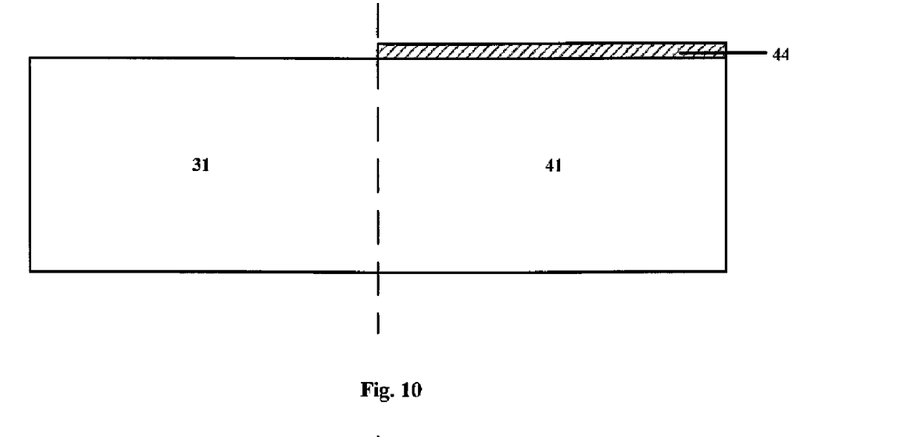
Figure 11:
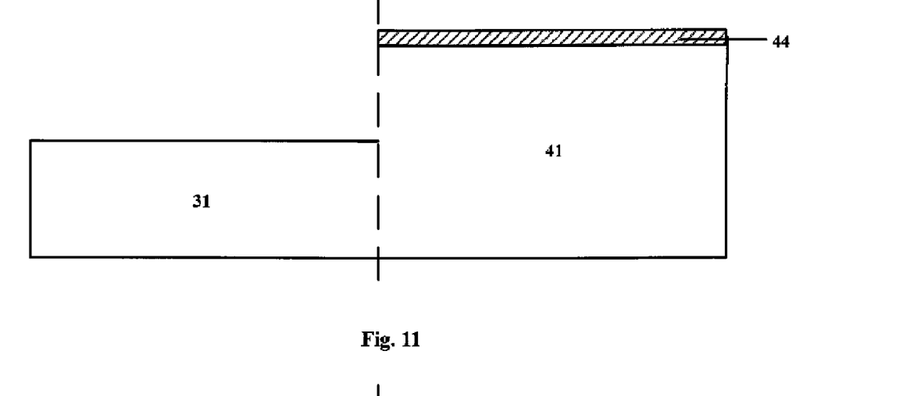
Figure 12:
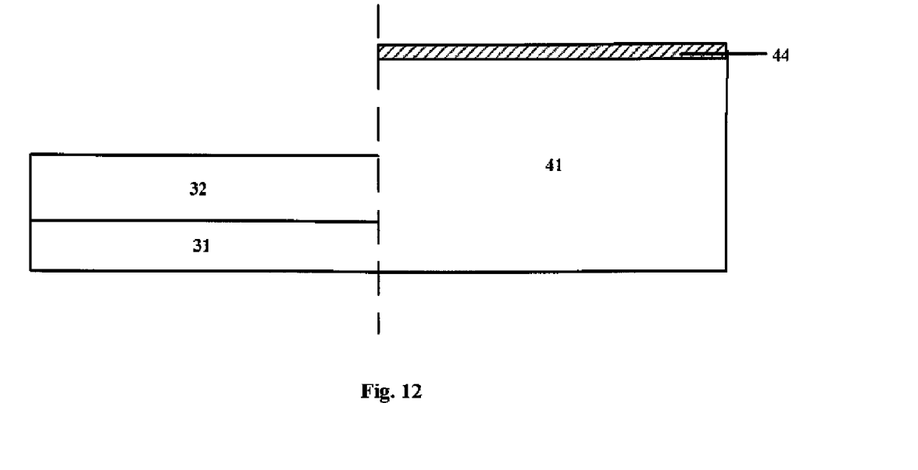
Figure 13:
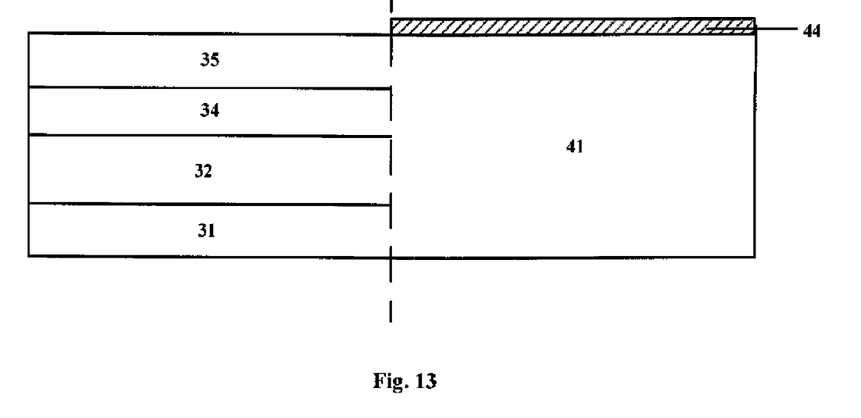

The method comprises:

S1601: providing a substrate including a storage substrate 31 and a peripheral substrate 41;

S1602: forming a sacrificial dielectric layer 44 on the peripheral substrate 41;

S1603: etching the storage substrate 31 and forming an N-type ion buried layer 32 on the storage substrate 31;

S1604: forming vertical LEDs on the N-type ion buried layer 32. Each vertical LED comprises an N-type conductive region 34 on the N-type ion buried layer 32, and a P-type conductive region 35 on the N-type conductive region 34. The P-type conductive region 35 contains SiGe. A top of P-type conductive region 35 is flush with a top of the peripheral substrate 41.

Figure 14:
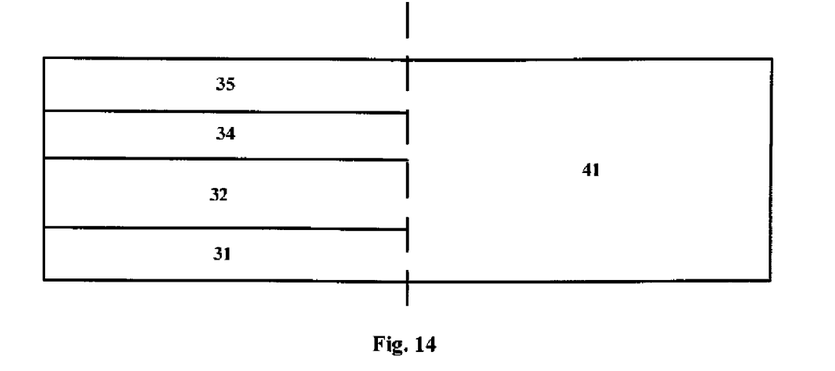

S1605: removing the sacrificial dielectric layer 44 on the peripheral substrate 41.

Figure 15:
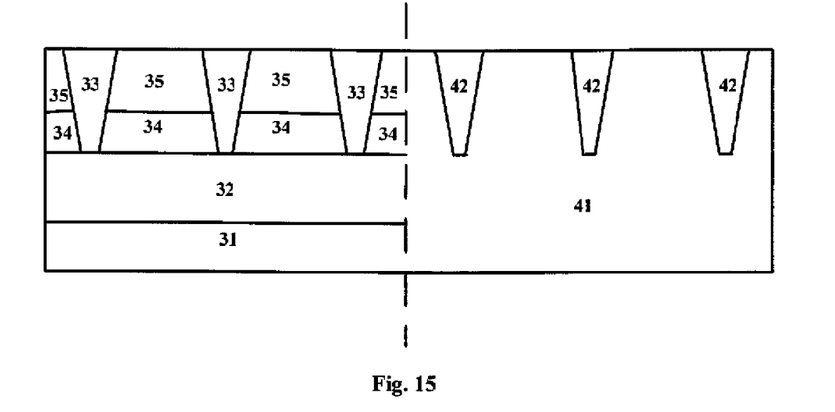

S1606: forming storage STI units 33 between the vertical LEDs, and forming peripheral STI units 42 in the peripheral substrate 41. The storage STI units 33 have thickness equal to thickness of the vertical LED, and the peripheral STI units 42 have thickness equal to thickness of the storage STI units 33.

S1607: forming phase change layers 36 on the vertical LEDs and between the storage STI units 33, and forming MOS transistors 43 on the peripheral substrate 41 and between the peripheral STI units 42.

Finally, a storage region 30 and a peripheral circuit region 40 are formed.

Referring to FIG. 9, in the step S1601, a substrate is provided, which includes a storage substrate 31 and a peripheral substrate 41. In one embodiment, the substrate is silicon-based, and comprises a storage substrate 31 and a peripheral substrate 41. Size of the storage substrate 31 and the peripheral substrate 41 depends on practical requirements.

Referring to FIG. 10, in the step S1602, a sacrificial dielectric layer 44 is formed on the peripheral substrate 41. The sacrificial dielectric layer 44 is formed in such a way that oxide or nitride (for example silicon nitride) is deposited on the peripheral substrate 41 by low pressure chemical vapor deposition or by plasma enhanced chemical vapor deposition. The sacrificial dielectric layer 44 has thickness ranging from 5 nm to 50 nm. In subsequent steps, selective epitaxial growth can be performed at a region exempt from the sacrificial dielectric layer 44.

In the step S1603, referring to FIG. 11, the storage substrate 31 is etched. Then, referring to FIG. 12, an N-type ion buried layer 32 is formed in the storage substrate 31.

In one embodiment, the storage substrate 31 is etched by wet etching or dry etching. The storage substrate 31 is far lower than the peripheral substrate 41. Etching thickness is equal to thickness of the vertical LEDs. Arsenic ions are implanted onto the etched storage substrate 31 for forming the N-type ion buried layer 32 in the storage substrate 31.

In another embodiment, the N-type ion buried layer is formed on the storage substrate, and then the storage substrate is etched. More specifically, arsenic ions are implanted into the storage substrate for forming the N-type ion buried layer. Notably, the implant energy of the arsenic ions is far larger than that of the aforementioned embodiment. Implant depth of the arsenic ions is larger than thickness of the vertical LEDs and is smaller than a sum of thickness of the vertical LEDs and thickness of the N-type ion buried layer. Then the storage substrate is etched by wet etching or dry etching for exposing the N-type ion buried layer. Etching thickness is equal to the thickness of the vertical LEDs.

Referring to FIG. 13, in the step S1604, the vertical LEDs are formed in the N-type ion buried layer 32. A fabrication method of the vertical LEDs comprises: forming the N-type conductive region 34 and the P-type conductive region 35. The N-type conductive region 34 is formed on the N-type ion buried layer 32, and the P-type conductive region 35 is formed on the N-type conductive region 34. The P-type conductive region 35 contains P-type ions and SiGe. A top of the P-type conductive region 35 is flush with a top of the peripheral substrate 41.

Four exemplary specific embodiments are described below for further explaining the fabrication method of the vertical LEDs.

According to a first exemplary specific embodiment, in the step S1604, an N-type conductive region 34 is formed on the N-type ion buried layer 32 by selective epitaxial growth. Reaction gases for selective epitaxial growth comprise Si atoms and N-type ions. Then a P-type conductive region 35 is formed on the N-type conductive region 34 by selective epitaxial growth. Reaction gases for selective epitaxial growth comprise SiGe and P-type ions.

In one embodiment, reduced pressure chemical vapor deposition (RPCVD) selective epitaxial growth is used for forming the N-type conductive region 35 on the N-type ion buried layer 32. The reaction gases of selective epitaxial growth comprise Si atoms and N-type ions. The sacrificial dielectric layer 44 is formed on the peripheral substrate 41. As a result, there are no Si atoms and the N-type ions on the peripheral substrate 41. It should be appreciated that other selective epitaxial growth method may be used.

The selective epitaxial growth reaction gases comprise Si atoms and N-type ions. The N-type ions are selected from arsenic ions and phosphorus ions. The growth source gases containing silicon are selected from $SiH_4$, $Si_2H_6$, $SiH_2Cl_2$ and the like. The flow of the growth source gases containing silicon is ranged from 50 to 1000 sccm. The selective gases comprise HCl, and the flow of the selective gases is ranged from 10 to 200 sccm. The carrying gases are $H_2$, and the flow of the carrying gases is ranged from 5 to 100 slm. The temperature of selective epitaxial growth is ranged from 600 to 1150 degree census, and pressure is ranged from 5 to 150 Torr.

The N-type ions comprise arsenic ions, and the growth source gases containing arsenic ions are AsH4 or the like. The flow of the growth source gases containing arsenic is ranged from 0.5 to 300 sccm.

Alternatively, the N-type ions comprise phosphorus ions, the growth source gases containing phosphorus ions are PH3. The flow of the growth source gases containing phosphorus is ranged from 0.5 to 300 sccm.

The P-type conductive region 35 is formed on the N-type conductive region 34 by selective epitaxial growth. The reaction gases of selective epitaxial growth comprise SiGe and P-type ions. The reaction gases SiGe contains Ge concentration with a molar ratio ranging from 20% to 60%. Preferably, the molar ratio of Ge is 20%, 30%, 40%, 50% or 60%. The P-type ions comprise boron ions, and the growth source gases containing boron comprise $B_2H_6$. The flow of the growth source gases containing boron is ranged from 0.5 to 300 sccm. The growth source gases containing silicon are selected from $SiH_4$, $Si_2H_6$, $SiH_2Cl_2$ and the like. The flow of the growth source gases containing silicon is ranged from 50 to 1000 sccm. The selective gases comprise HCl, and the flow of the selective gases is ranged from 10 to 200 sccm. The carrying gases are $H_2$, and the flow of the carrying gases is ranged from 5 to 100 slm. The growth source gases containing Ge comprise $GeH_4$. The flow of the growth source gases containing Ge concentration is ranged from 5 to 500 sccm. The temperature of selective epitaxial growth is ranged from 600 to 1150 degree census, and pressure is ranged from 5 to 150 Torr.

The N-type conductive region 34 and the P-type conductive region 35 are completed. In the vertical LED on the N-type ion buried layer 32, a top of the P-type conductive region 35 is flush with a top of the peripheral substrate 41.

In a second exemplary specific embodiment for showing formation of vertical LEDs on the N-type ion buried layer 32, a fabrication method of the vertical LEDs comprises: (1) an N-type conductive region 34 is formed on the N-type ion buried layer 32 by selective epitaxial growth, and reaction gases for selective epitaxial growth comprise Si atoms and N-type ions; (2) a SiGe layer is formed on the N-type conductive region 34 by selective epitaxial growth, and P-type ions are implanted into the SiGe layer for forming the P-type conductive region 35. The P-type conductive region 35 contains Ge concentration with a molar ratio ranging from 20% to 60%.

In this embodiment, a SiGe layer is formed on the N-type conductive region 34 by selective epitaxial growth. A top of the SiGe layer is flush with a top of the peripheral substrate 41. P-type ions are implanted into the SiGe layer by ion implant for forming the P-type conductive region 35.

In a third exemplary specific embodiment for showing formation of a vertical LED on the N-type ion buried layer 32, a fabrication method of the vertical LEDs comprises: (1) a Si layer is formed on the N-type ion buried layer 34 by selective epitaxial growth, and N-type ions are implanted into the silicon layer for forming the N-type conductive region 34; (2) the P-type conductive region 35 is formed on the N-type conductive region 34 by selective epitaxial growth, and reaction gases for selective epitaxial growth comprise SiGe and P-type ions. The reaction gas SiGe contains Ge concentration with a molar ratio ranging from 20% to 60%. Notably, the P-type conductive region 35 and the N-type conductive region 34 are formed at the same time.

In this embodiment, a monocrystalline Si layer is formed on the N-type ion buried layer 32 by selective epitaxial growth, and then N-type ions are implanted into the monocrystalline layer for forming the N-type conductive region 34.

In a fourth exemplary specific embodiment for showing formation of a vertical LED on the N-type ion buried layer 32, a fabrication method of the vertical LED comprises: (1) a monocrystalline Si layer is formed on the N-type ion buried layer 32 by selective epitaxial growth, and N-type ions are implanted into the monocrystalline layer for forming the N-type conductive region 34; (2) a SiGe layer is formed on the N-type conductive region 34 by selective epitaxial growth, and P-type ions are implanted into the SiGe layer for forming the P-type conductive region 35. The reaction gas SiGe contains Ge concentration with a molar ratio ranging from 20% to 60%.

In the four exemplary specific embodiments for showing formation of a vertical LED, the N-type conductive region comprises N-type ions and Si atoms. Alternatively, the silicon may be replaced with SiC. The N-type conductive region comprises N-type ions and SiC. The SiC layer is formed on the N-type ion buried layer 32 by selective epitaxial growth, and growth source gases containing carbon may be $C_3H_8$ or the like. The flow of the growth source gases containing carbon is ranged from 5 to 500 sccm. In the N-type conductive region 34, the reaction gas SiC has C concentration with a molar ratio ranging from 1% to 3%. Preferably, the molar ratio of the C concentration is 1%, 2% or 3%.

Referring to FIG. 14, in the step S1605, the sacrificial dielectric layer 44 on the peripheral substrate 41 is removed. In one embodiment, the sacrificial dielectric layer 44 on the peripheral substrate 41 is removed by wet etching. In an alternative embodiment, the sacrificial dielectric layer 44 on the peripheral substrate 41 may be removed by other processes in prior art.

Referring to FIG. 15, in the step S1605, the storage STI units 33 are formed between the vertical LEDs. The peripheral STI units 42 are formed in the peripheral substrate 41. The storage STI units 33 have thickness identical to thickness of the vertical LEDs, and the peripheral STI units 42 have thickness identical to thickness of the storage STI units 33.

In the step S1607, phase change layers 36 are formed on the vertical LEDs and between the storage STI units 33. MOS transistors 43 are formed on the peripheral substrate 41 and between the peripheral STI units 42.

Finally, the storage region 30 and the peripheral circuit region 40 are completed to form the phase change memory of FIG. 8. The number of the MOS transistors may vary depending on requirements. In one embodiment, a heating layer is provided between P-type conductive regions 35 and the phase change layers 36 before formation of the phase change layers 36.

By the present invention, the P-type conductive region containing SiGe reduces drain current through the vertical LEDs, thereby raising current efficiency of the vertical LEDs. On the other hand, the storage substrate is etched, and height difference is apparently formed between the storage substrate and the peripheral substrate. The sacrificial dielectric layer is formed on the peripheral substrate for forming the N-type ion buried layer and the vertical LEDs on the storage substrate in sequence. A top of the vertical LEDs is flush with a top of the peripheral substrate. Then the sacrificial dielectric layer on the peripheral substrate is removed. In this way, a monocrystalinne layer on the peripheral substrate is not needed. The peripheral circuit region can work normally without adverse influence on performance of the phase change memory.

The invention is disclosed, but not limited, by preferred embodiment as above. Based on the disclosure of the invention, those skilled in the art shall make any variation and modification without deviation from the scope of the invention. Therefore, any simple modification, variation and polishing based on the embodiments described herein belongs to the scope of the invention.

What is claimed is:

1. A method for fabricating a phase change memory, comprising:
   providing a substrate including a storage substrate and a peripheral substrate;
   forming a sacrificial dielectric layer on the peripheral substrate;
   etching the storage substrate and forming an N-type ion buried layer on the storage substrate;
   forming a plurality of vertical LEDs on the N-type ion buried layer, wherein a top of a P-type conductive region is substantially flush with a top of the peripheral substrate;
   removing the sacrificial dielectric layer from the peripheral substrate;
   forming a plurality of storage shallow trench isolation (STI) units between the vertical LEDs, and forming a plurality of peripheral shallow trench isolation (STI) units in the peripheral substrate, the storage STI units having thickness equal to thickness of the plurality of vertical LEDs, and the plurality of peripheral STI units having thickness equal to thickness of the plurality of storage STI units; and
   forming a plurality of phase change layers on the plurality of vertical LEDs and between the plurality of storage STI units, and forming a plurality of MOS transistors on the peripheral substrate and between the plurality of peripheral STI units.

2. The method according to claim 1, wherein the N-type ion buried layer is formed by implanting N-types ions into the storage substrate before etching the storage substrate.

3. The method according to claim 1, wherein the N-type ion buried layer is formed by implanting N-types ions into the storage substrate after etching the storage substrate.

4. The method according to claim 1, wherein an N-type conductive region is formed on the N-type ion buried layer by selective epitaxial growth, and reaction gases for the selective epitaxial growth comprise silicon atoms and N-type ions.

5. The method according to claim 1, wherein a silicon layer is formed on the N-type ion buried layer by selective epitaxial growth, and N-type ions are implanted into the silicon layer for forming an N-type conductive region.

6. The method according to claim 1, wherein an N-type conductive region is formed on the N-type ion buried layer by selective epitaxial growth, and reaction gases for selective epitaxial growth comprise SiC and N-type ions.

7. The method according to claim 6, wherein the SiC has C concentration with a molar ratio ranging from 1% to 3%.

8. The method according to claim 1, wherein a SiC layer is formed on the N-type ion buried layer by selective epitaxial growth, and N-type ions are implanted into the SiC layer for forming an N-type conductive region.

9. The method according to claim 8, wherein the SiC layer has C concentration with a molar ratio ranging from 1% to 3%.

10. The method according to claim 1, wherein the P-type conductive region is formed on an N-type conductive region by selective epitaxial growth, and wherein reaction gases comprise SiGe and P-type ions.

11. The method according to claim 1, wherein a SiGe layer is formed on an N-type conductive region by selective epitaxial growth, and P-type ions are implanted into the SiGe layer for forming the P-type conductive region.

12. The method according to claim 1, wherein the SiGe contains Ge concentration with a molar ratio ranging from 20% to 60%.

13. The method according to claim 1, wherein the sacrificial dielectric layer has thickness ranging from 5 nm to 50 nm.

14. The method according to claim 1, wherein oxide or nitride is deposited on the peripheral substrate by low pressure chemical vapor deposition for forming the sacrificial dielectric layer.

15. The method according to claim 1, wherein oxide or nitride is deposited on the peripheral substrate by plasma enhanced chemical vapor deposition for forming the sacrificial dielectric layer.

* * * * *